United States Patent
Heise et al.

[19]

[11] Patent Number: 6,023,548
[45] Date of Patent: Feb. 8, 2000

[54] DEVICE FOR THE CONVERSION OF A PLURALITY OF LIGHT BEAMS INTO A MORE COMPACT ARRANGEMENT OF LIGHT BEAMS

[75] Inventors: Gerhard Heise; Reinhard Maerz; Herbert Michel, all of Munich, Germany

[73] Assignee: Siemens Aktiengesellschaft, Munich, Germany

[21] Appl. No.: 09/049,443

[22] Filed: Mar. 27, 1998

[30] Foreign Application Priority Data

Mar. 27, 1997 [DE] Germany ............... 197 13 187

[51] Int. Cl.[7] ............... G02B 6/08; G02B 27/10
[52] U.S. Cl. ............... 385/120; 385/31; 385/147; 385/901; 359/618
[58] Field of Search ............... 385/31, 120, 121, 385/147, 191; 359/618, 621–624

[56] References Cited

U.S. PATENT DOCUMENTS 5,625,736  4/1997  Veligdan ............... 385/120
5,684,906  11/1997  Sugawara ............... 385/120

FOREIGN PATENT DOCUMENTS 196 12 673  4/1996  Germany.
195 14 625  10/1996  Germany.
195 37 265  2/1997  Germany.

*Primary Examiner*—John D. Lee
*Assistant Examiner*—Juliana K. Kang
*Attorney, Agent, or Firm*—Hill & Simpson

[57] ABSTRACT

A device for planar light-guiding layers arranged one above the other and having an infeed end face for coupling a respective light beam in the layer and an outfeed end face for coupling light from each of the layers, each of the layers being provided with an arrangement for deflecting light coupled in one of the end faces toward the other end faces so that a plurality of individual light beams can be converted into a more compact arrangement of a light beam or a light beam of a larger cross section can be converted into a plurality of smaller sub-beams having a smaller cross section.

11 Claims, 5 Drawing Sheets

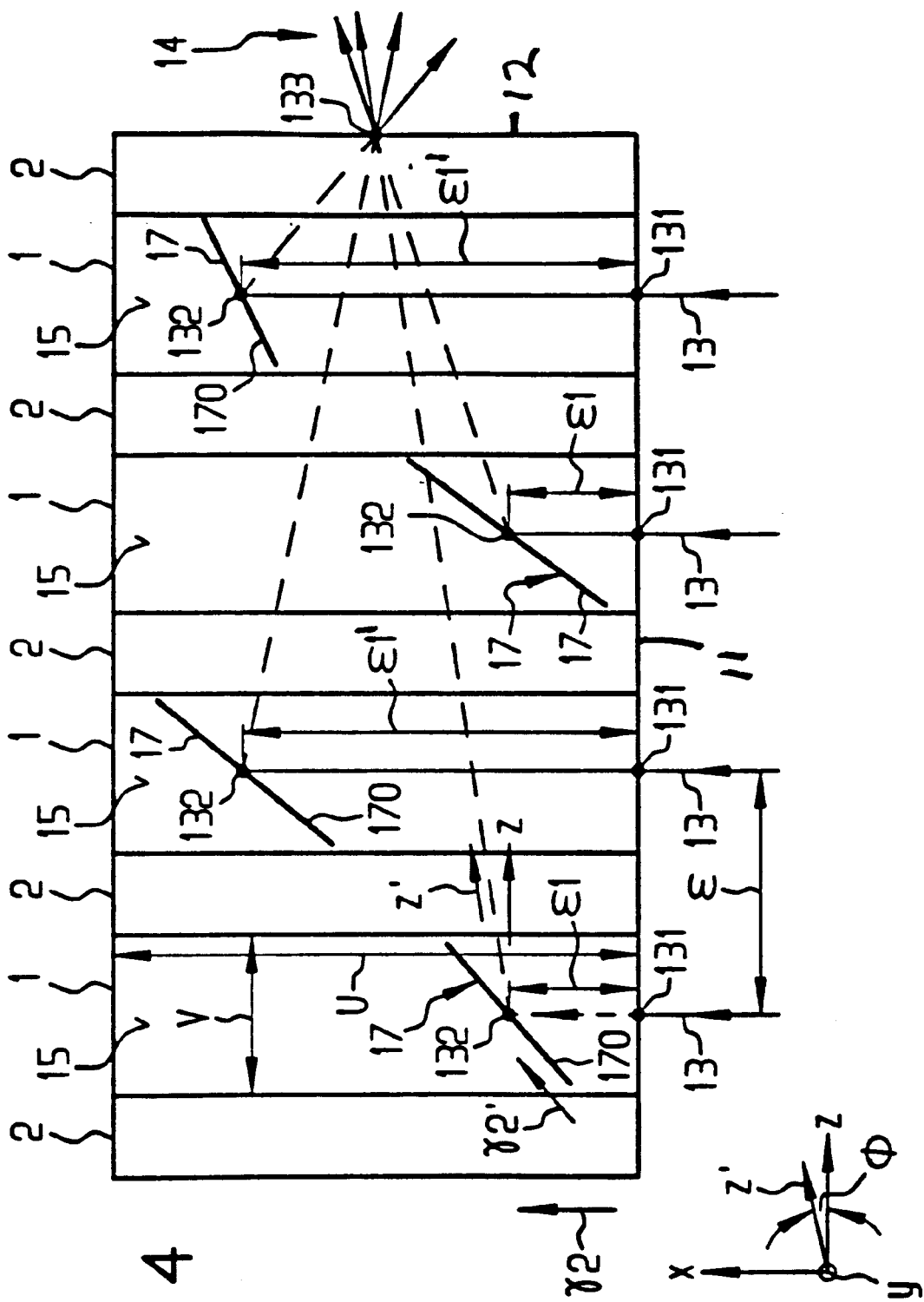

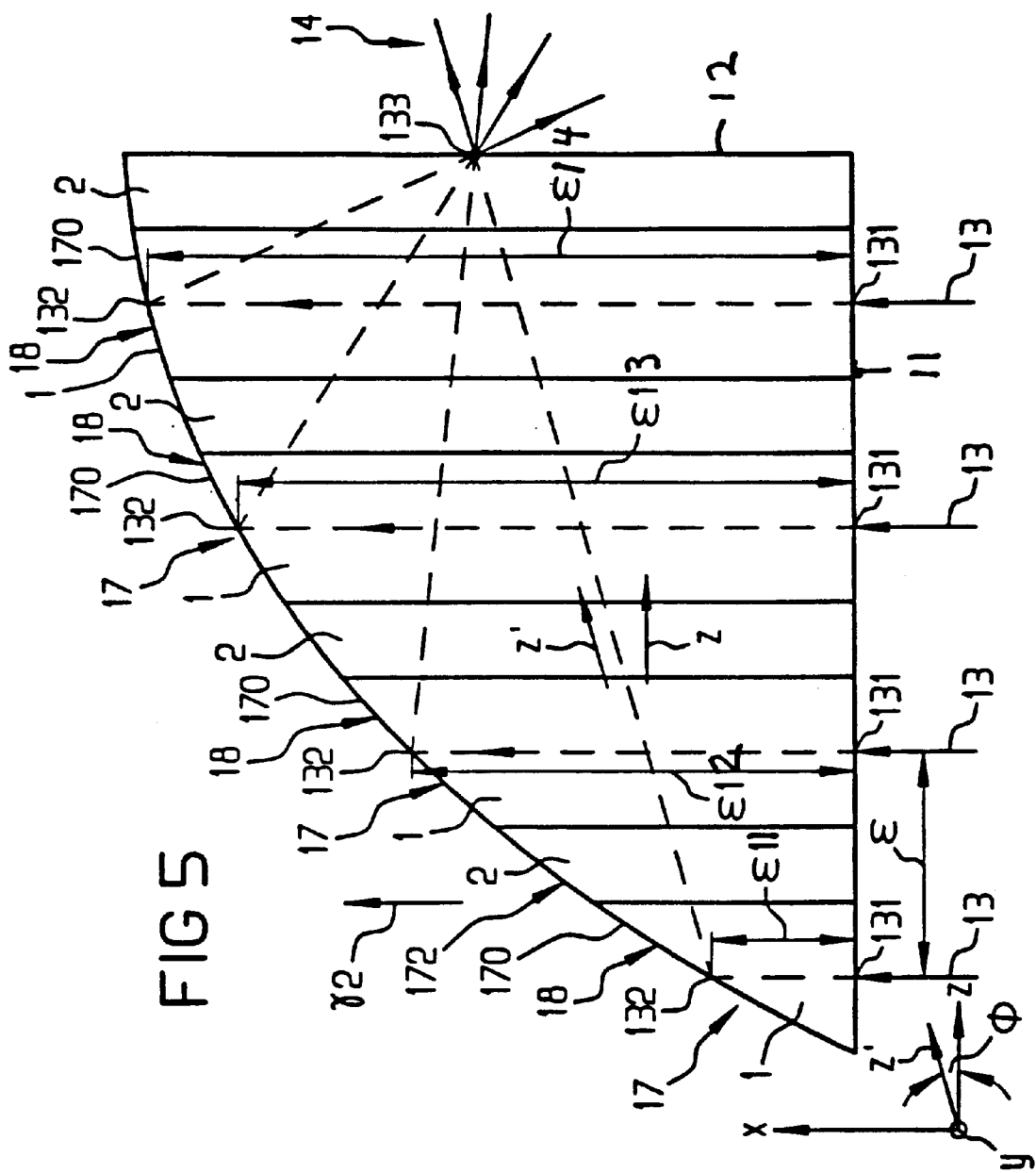

DEVICE FOR THE CONVERSION OF A PLURALITY OF LIGHT BEAMS INTO A MORE COMPACT ARRANGEMENT OF LIGHT BEAMS

BACKGROUND OF THE INVENTION

The present invention is directed to a device for the conversion of a plurality of light beams into a more compact arrangement of light beams comprising a plurality of light guiding layers, which are provided for infeed, guidance and outfeed of one of the light beams, each layer having an infeed end face for coupling respective light beams into the layer and an outfeed end face in which the light beam in the layer is coupled out of the layer, and the outfeed end faces and the light beams coupled out from the outfeed faces are arranged one above the other in a direction extending perpendicular to a defined plane to outfeed the light beams to a more compact device.

German Published Application 196 12 673 discloses a device which has a plurality of light-conducting layers, with each layer having an infeed end face and each layer having an outfeed end face, with the outfeed end faces being arranged one above the other so that the light coupled from the outfeed faces is arranged in a stacked order. In this known device, the plurality of light-guiding or light-conducting layers are composed of elongated, strip-like optical waveguides, whose infeed end faces and, accordingly, whose end sections adjoining these faces are arranged in a common plane extending parallel to a defined plane and are arranged side-by-side with a predetermined spacing. By contrast thereto, the outfeed end faces and, accordingly, the end sections of these waveguides adjoining these outfeed faces are stacked one above the other in a direction extending perpendicular to the defined plane.

Each waveguide whose infeed end face extends parallel to the defined plane is laterally offset relative to the outfeed end face of this waveguide and comprises a slightly S-shaped curvature that is all the more pronounced the greater the lateral spacing between the infeed end faces from the outfeed end faces of the waveguide.

The predetermined spacing of the infeed end faces of the waveguide corresponds to the predetermined spacing parallel to the defined plane in which the light beams are to be fed to the waveguide through these end faces and to be compacted and spread from one another.

A manual preparation is required in the manufacturing of this known device, wherein the individual waveguides are placed on top of one another at their outfeed end faces.

SUMMARY OF THE INVENTION

The present invention is to provide a device wherein a manual placement of the plurality of the layers on top of one another is avoided and, advantageously the inventive device can be produced in the form of a layer stack from the very outset that can be unproblematically manufactured with traditional, simple methods.

To accomplish these goals, the present invention is directed to a device with light-guiding layers that are composed of flat, planar layers that are arranged parallel to a defined plane one above the other in a first direction extending perpendicular to the defined plane so that both the infeed end faces as well as the outfeed end faces of the various layers are located one above the other in the first direction and that the infeed light beam is propagated essentially freely in each layer. The light beams can be coupled into the layers through the infeed end faces upon retention of their spacing from one another parallel to the defined plane and beam deflecting means are provided for each layer, which beam deflecting means deflect the infeed light beam guided in the layer to the outfeed end face of the layer so that the light beams deflected by the beam deflecting means are incident onto the outfeed end faces above one another in the first direction perpendicular to the defined plane.

In the inventive device, which differs from the known device, the light-guiding layers are not elongated strip-shaped optical waveguides that allow a light propagation only in their longitudinal direction and not transversely thereto and largely lead curved from one plane into another, but are respectively flat planar layers in each of which the light is guided only between the two flat sides of the layer and can be freely propagated in all directions parallel to the layer plane of the layer, so that guidance of light is present in a specific direction parallel to the layer plane of the layer that is parallel to the defined plane.

Differing from the known devices, the infeed end faces of the inventive device are not arranged side-by-side parallel to the defined plane, but are arranged above one another in a first direction perpendicular to the defined plane.

Upon retention of the spacing from one another parallel to the defined plane, the light beams are to be coupled into the layers through the infeed end faces. Since the infeed end faces are arranged one above the other in a direction perpendicular to the defined plane, this means that, differing from the known device, the light beams to be coupled in can propagate in a plane parallel to the defined plane, but must be offset relative to one another in a direction perpendicular to the defined plane.

In the inventive device, the infeed end faces advantageously need not be separately fashioned. It suffices when they exhibit an adequate length in a direction parallel to the defined plane. The beam deflecting means is fashioned in every layer, this deflecting the infed light beam guided in this layer to the outfeed end face of the layer, so that the light beams deflected from all beam deflection means are incident onto the outfeed end faces one above the other in a direction extending perpendicular to the defined plane.

The beam deflecting means of the inventive device can be realized in various ways. Let it be pointed out that a beam deflecting means in the form of a slightly S-shaped curvature of an elongated, strip-like waveguide is already present in the initially-explained known devices. It would be conceivable, given the inventive device, to provide a beam deflecting means in the light waveguide layer in the form of a curved, strip-like waveguide locally fashioned in this layer.

Preferably and advantageously, however, the beam deflecting means, given the inventive device, is fashioned as a reflective surface formed in the layer and residing essentially perpendicular to the defined plane for the deflection of light beams guided in the layer in a direction to outfeed end face. Thus, the reflective surface of the beam deflecting means can be advantageously generated by etching or by local diffusion or implantation of dopants that modify the refractive index of the specific light-guiding layer.

Last, but not least, it is advantageous to fashion the inventive device with a third end face that is arranged obliquely at an angle to the defined plane and at an angle to the infeed end face of the layer, as measured in the defined plane, and is uncovered and the beam deflecting means of the layer is fashioned in the region of this third end face of the layer. This embodiment has the advantage that the third end face of the light-guiding layers are freely accessible for the fashioning of the respective beam deflecting means and do not have to be uncovered. The manufacture of this third end face can also be advantageously obtained very simply by grinding off the layer stack composed of the light-guiding layers obliquely at an angle relative to the defined plane and polishing the oblique facet or surface. In this case, the third end faces are all advantageously arranged in the polished facet, which preferably defines one plane.

Moreover, there is the advantage that the layer thickness of the light-guiding layers is reduced in the region of the third end face slanting relative to the layer plane. This facilitates the manufacturing of the reflective face by etching or diffusion or implantation, since the etched, diffused or implantation depth is reduced in the region of every end face.

Each light beam coupled into the light-guiding layer can propagate convergently, divergently or as parallel beams in a respective layer, so that the beam is increasingly narrowed, broadened or, respectively, remains essentially constant in width as it moves in the propagation direction parallel to the defined plane.

According to one embodiment, the inventive device advantageously comprises a beam-shaping means for shaping the light beam guided in the layer and propagating parallel to the defined plane. The divergence, convergence and parallelism of a light beam guided in a layer can be modified, particularly also converted into one another, with such a beam-shaping means. In particular, there is the advantageous possibility with such a beam-shaping means of imaging a beam exit window from which a light beam is to be coupled into the light-guiding layer through the infeed end face thereof as a real image with a selectable imaging scale, for example a light exit window of a laser. In this case, the beam-shaping means acts as an imaging optics and light exit windows arranged spaced from one another can be imaged real in a more compact arrangement with the inventive means in this way.

Such a beam-shaping means can be advantageously comprised in the form of a beam deflecting means fashioned in the layer in the form of a reflective surface that proceeds curved parallel to the defined plane. In this case, the beam deflecting means and the beam-shaping means of the light-guiding layer advantageously form a unit that can be just as easily obtained as the beam deflecting means of the layer by itself.

According to the invention, the two light-guiding layer are advantageously separated by a layer with a lower refractive index compared to the refractive index of the light-guiding layers that are arranged between these layers. This layer with a lower refractive index automatically forms an optical cladding layer for both light-guiding layers. The light-guiding layers themselves can be layers with a continuous mode spectrum, multi-mode waveguide layers and monomode waveguide layers, which are respectively known and can be manufactured in a known way or manner. All known manufacturing methods can be utilized to form the device.

Another advantage of the development of the present invention is that the beam deflecting layers can be arranged at the same distance from the infeed end faces or they can be arranged at different distances, if desired.

The inventive device is advantageously employable for the conversion of the divergent light beams generated by a plurality of semiconductor lasers and propagating with a predetermined spacing from one another parallel to the defined plane into a relatively more compact arrangement of these light beams that, for example, can be coupled into an optical multi-mode waveguide, particularly a multi-mode fiber.

In this employment, the inventive device can be advantageously utilized in welding and soldering technology, in medicine and in printing technology, and an optimally high optical power, particularly on the order of magnitude of several watts, can be brought into a point of utilization in these use possibilities, for example via the multi-mode waveguide. Limits are placed on the optical power of an individual semiconductor laser, particularly due to the loadability of the light exit face of the laser and due to the current density in the laser. Several watts of optical power can be achieved with the inventive device by combining the optical power of a plurality of individual semiconductor lasers, particularly power semiconductor lasers, so that a power laser arrangement having especially high power can be obtained.

Conversely, the inventive device can be employed for the conversion of a light beam with a larger beam cross section that, for example, emerges from a multi-mode waveguide, particularly a multi-mode fiber, into a plurality of sub-beams with a respectively smaller beam cross section propagating spaced from one another, whereby the outfeed end faces are to be employed for coupling the light beam with the larger cross section into the light-guiding layers and the infeed end faces are to be employed for coupling the sub-beams with the respectively smaller beam cross sections out of the device.

Other advantages and features of the invention will be readily apparent from the following description of the preferred embodiments, the drawings and claims.

BRIEF DESCRIPTION OF THE DRAWINGS

FIG. 4 is a plan view taken on a plane extending perpendicular to the infeed side of a modification of the device of FIG. 1; and FIG. 5 is a plan view taken on a plane extending perpendicular to the infeed side of another modification of the device of the present invention.

DESCRIPTION OF THE PREFERRED EMBODIMENTS

Figure 1:
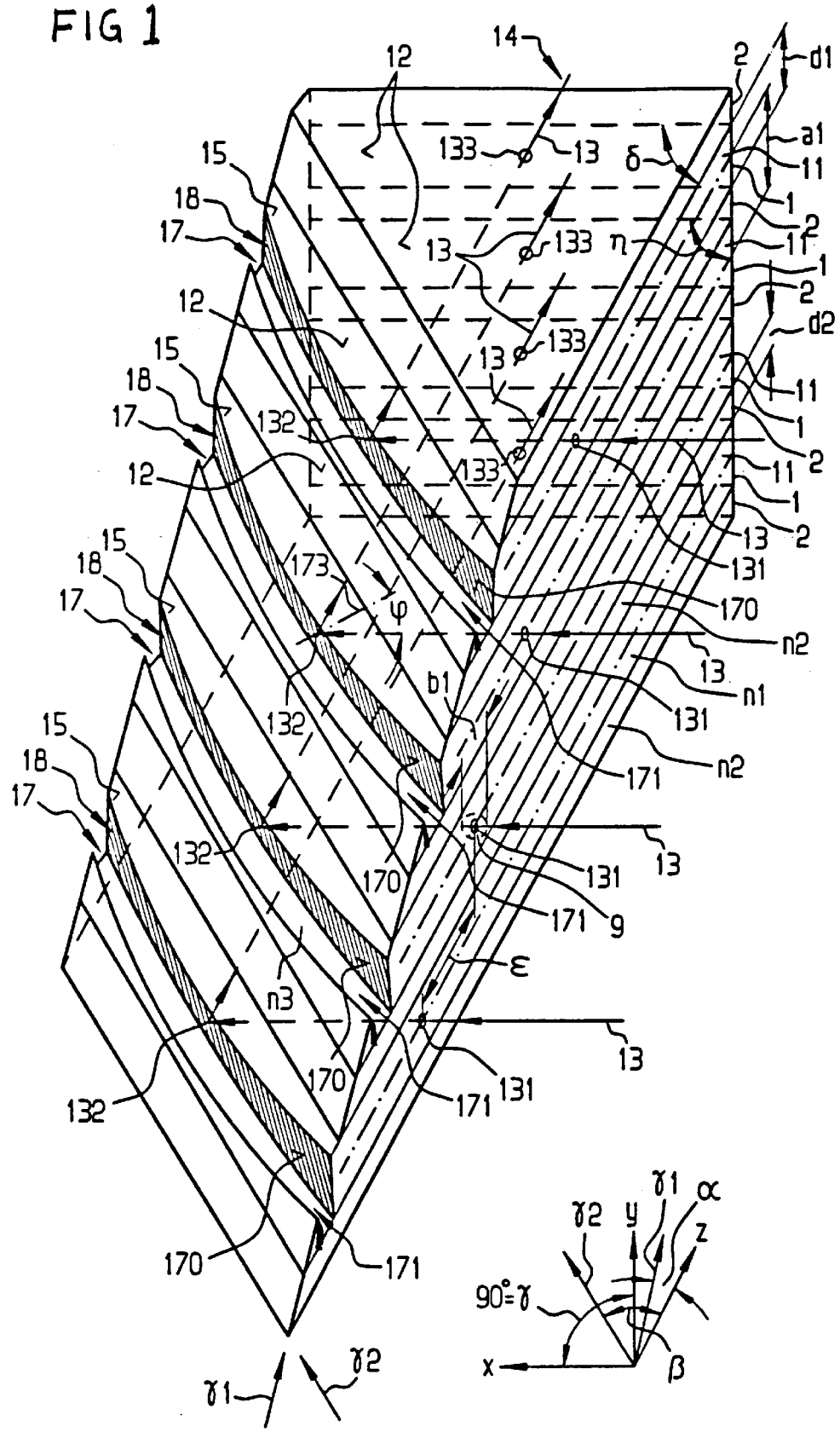
FIG. 1 is a perspective view of a preferred embodiment of the inventive device according to the present invention, which device is suitable for the conversion of light beams generated by a line of semiconductor lasers into a more compact arrangement of light beams so that they can be coupled into a multi-mode fiber.
Figure 2:
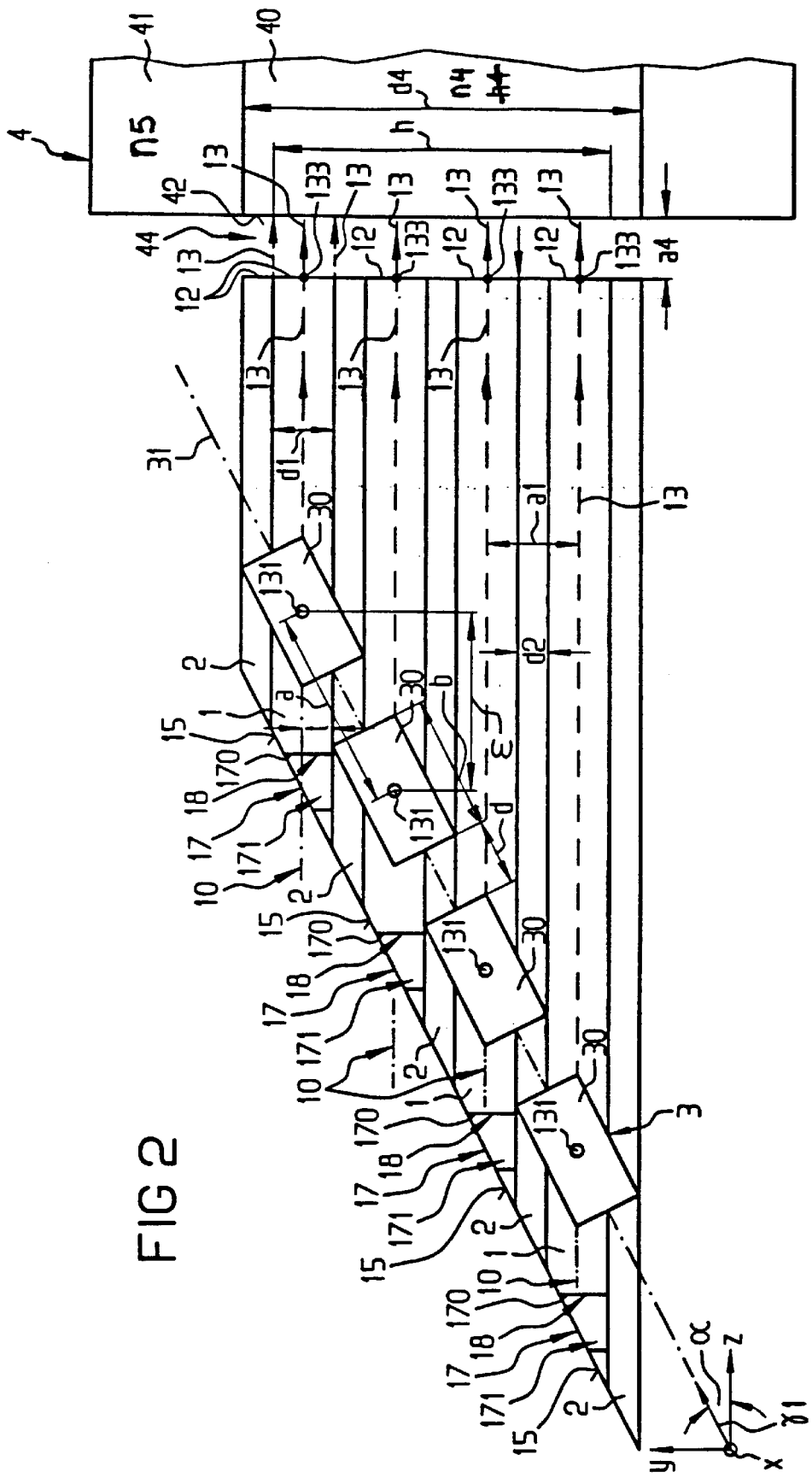
FIG. 2 is a plan view of the infeed side of the device of FIG. 1 with a line of semiconductor lasers arranged in front of the infeed side.
Figure 3:
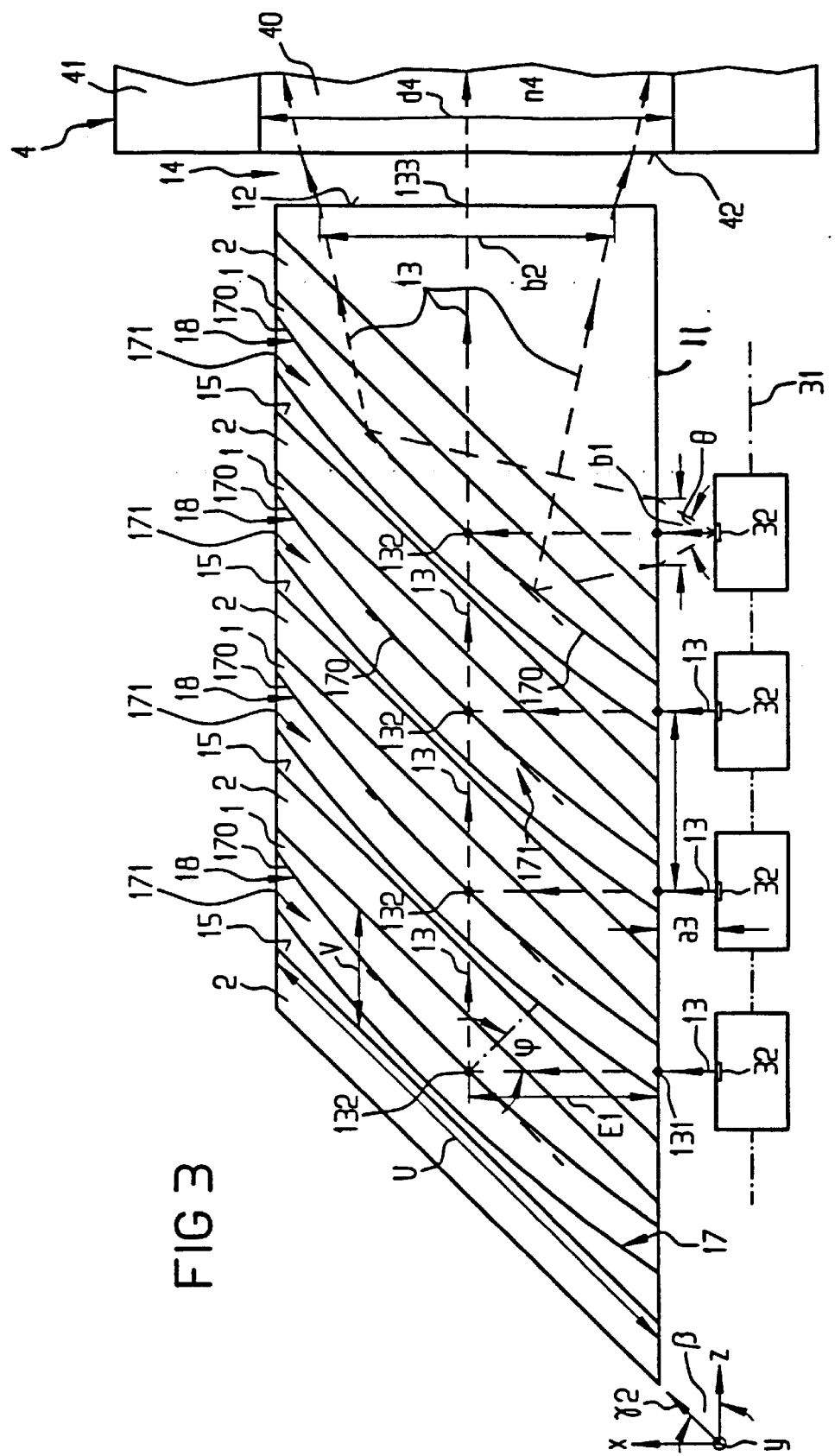
FIG. 3 is a plan view taken on a plane extending perpendicular to the plane of the infeed side of the device of FIG. 1.

The principles of the present invention are particularly useful when incorporated in a device for converting a plurality of light beams that propagate with a predetermined spacing from one another but parallel to a defined plane into a relatively more compact device, as illustrated in FIGS. 1–3.

In the Figures, the plurality of light-guiding layers 1 have infeed end faces 11 and outfeed end faces 12. Each of these layers 1 has an additional or third end face 15. Each of the layers has an existing beam deflecting means 17 and an existing beam-shaping means 18.

The light beams 13, which are to be converted into a more compact beam 14 by the inventive device, are coupled into respectively one of the light-guiding layers 1 through the infeed end face 11. Each of these beams is guided in the layer 1 and deflected by a deflecting means 17 to be coupled out of the outfeed end face 12.

In all embodiments, respectively, two neighboring light-guiding layers 1 are separated by intermediate layers 2, which are arranged between two layers 1, and the intermediate layers have a lower refractive index n2 compared to the refractive index n1 of the light-guiding layers 1. Optimally, the refractive indices n1 and n2 of the light-guiding layers 1 and the intermediate layers 2 are to be selected so that an optical coupling between the light-guiding layers 1 is optimally slight.

An optical medium having a lower refractive index compared to the refractive index of the layer 1 must adjoin each light-guiding layer 1 on both sides. This optical medium can be composed of a layer 2 with the lower refractive index n2 given all of the layers 1.

The light-guiding layers 1 all have a layer plane 10 which extending parallel to one another and are shown in FIGS. 1 and 2 as dot-dashed lines, which are arranged parallel to a coordinate plane formed by coordinates x, z, which are two directions of rectangular coordinates x, y, z, which are indicated in all Figures. The coordinate plane x, z forms the defined plane x, z.

The illustration is such in FIG. 2 that the coordinate plane y, z that is erected by the directions y and z and extend perpendicular to the defined plane x, z is parallel to the plane of the drawing, so that both the defined plane x, z together with the layer planes 10 extend perpendicular to the plane of the drawing, which plane is defined by the plane x, y. In FIGS. 3–5, by contrast, the defined plane x, z together with the layer planes 10 are shown parallel to the plane of the drawing, so that the other coordinate planes, such as the y, z plane and the x, y plane, respectively, extend perpendicular to the plane of the drawing.

Moreover, the illustration in such FIGS. as 2–5, the defined plane x, z extends perpendicular to the plane of the drawing in FIG. 2 and is horizontally arranged in the plane of the drawing for FIGS. 3–5. Accordingly, the coordinate plane x, y extends perpendicular to the plane of the drawing in FIGS. 2–5 and the plane y, z extends perpendicular to the plane of the drawings in FIGS. 3–5, but is in the plane of the drawing in FIG. 2.

The infeed end face 11 of every light-guiding layer 1 is advantageously arranged so that it is arranged at an angle γ to the defined plane x, z, and this preferably amounts to 90° in the illustrated embodiments, and is the angle between the direction x parallel to the defined plane x, z and the direction y perpendicular to the defined plane x, z. Without limitations on the universality, let the infeed end face 11 of each light-guiding layer 1 be parallel to the coordinate plane y, z.

In all embodiments, the outfeed end face 12 of every light-guiding layer 1 resides at an angle δ to the infeed end face 11 of the layer 1 and at η angle 11 to the defined plane x, z. The angle δ preferably amounts to 90° and is identical to the angle between the direction x respectively parallel to the defined plane x, z and the direction z, while the angle η preferably likewise amounts to 90° and is identical to the angle between the direction y perpendicular to the defined plane x, z and the direction z parallel to the defined plane x, z, so that the outfeed end face 12 of every light-guiding layer 1 is parallel to the coordinate plane x, y in this specific case.

In all embodiments, the third end face 15 of every light-guiding layer 1 slants at an angle α (FIG. 2) relative to the defined plane x, z and is arranged at an angle β relative to the infeed end face 11 of the layer 1. Each angle α is measured in the coordinate plane y, z to which the infeed end face 11 of the layer 1 is parallel, and lets the angle β be measured in the coordinate plane x, z to which the layer plane 10 of this layer 1 is parallel.

In addition to the layer thickness and refractive index of the light-guiding layers 1 and the layers 2, the angles γ, δ and in and, in particular, α and β are largely freely selectable design parameters, so that there is advantageously a high degree of freedom given the inventive device for adapting this device to specific conditions of individual cases. Each selected parameter is to be exactly adhered to, except for, respectively, prescribable, allowable tolerances.

The embodiments of FIGS. 1–3 differ from the embodiments of FIGS. 4 and 5 in that the third end face 15 of every light-guiding layer 1 in the embodiments of FIGS. 1–3 are arranged not only obliquely at an angle α<90° to the defined plane x, z but also obliquely at an angle β<90° to the infeed end face 11 of the layer 1. However, the third end face 15 of every light-guiding layer 1 in the embodiments of FIGS. 4 and 5 is arranged at an angle β=90°, which is perpendicular to the infeed end face 11 of this layer.

In all embodiments, the infeed end faces 11, the outfeed end faces 12 and the third end faces 15, as shown in the Figures, are respectively arranged together in a common plane and not in planes that differ from one another. Under specific conditions, the common plane of the infeed end faces 11 is arranged parallel to the coordinate plane y, z, the common plane of the outfeed faces 12 is arranged parallel to the coordinate plane x, y and the common plane of the additional end face 15 is arranged at least obliquely at an angle a relative to the defined plane x, z. In the embodiment illustrated in FIGS. 1–3, the common plane of the third end face 15 is additionally arranged obliquely at an angle β<90° and in the exemplary embodiments of FIGS. 4 and 5, by contrast, they are arranged at an angle β=90° to the coordinate plane y, z.

In this case, a direction γ1 parallel to the coordinate plane x, z is defined by the intersection line of the plane of the infeed end faces 11 and the plane of the third end faces 15 residing at an angle thereto, and this direction γ1 describes the angle a in this coordinate plane y, z with the direction z parallel to the defined plane x, z; and a direction γ2 parallel to the defined plane x, z is defined by the intersection line of the layer plane 10 of every light-guiding layer 1 parallel to the defined plane x, z and the plane of the end faces 15 reside at an angle relative to the plane of the infeed end face 11, with the end face 15 extending in this direction γ2 and this describing the angle β in the defined plane x, z with the direction z parallel to the defined plane x, z that is less than or equal to 90°.

In all embodiments, the beam deflecting means 17 is formed in the region of the third end face 15 of each light-guiding layer 1, which preferably comprises a reflective surface 170 fashioned in this layer 1 that is essentially arranged in the direction y perpendicular to the defined plane x, z. Here, "essentially" means that the reflective surface 170 can deviate within an allowable angular range from the direction y perpendicular to the defined plane x, z within which it is assured that the light beam 13 guided in this layer 1 is reflected at the reflective surface 170 and continues to be guided in this layer 1 after the reflection.

The size of the allowable angular range is dependent on the degree of light guidance in the light-guiding layer, particularly on the refractive index n1 thereof and on the refractive index n2, which is lower thereto, of the two layers 2 adjoining the layer 1. For example, the reflective surface 170 of the light-guiding layer 1 can, under certain circumstances, deviate up to 10° toward one or the other side from the direction y perpendicular to the defined plane x, z.

A reflective surface 170 can be generated in a simple way in a light-guiding layer 1 in that, among other things, a recess or depression 171 (see FIGS. 1–3) is generated in the region of the advantageously freely accessible third end face 15 of the layer 1. This recess or depression 171 has sidewalls extending perpendicular to the layer plane 10 of the layer 1 onto which the light beam 13 with the smaller beam cross section g coupled in through the infeed end face 11 of the layer 1 and guided in this layer 1 parallel to the layer plane 10 thereof and, thus, in the defined plane x, z, is obliquely incident at an incident angle $\phi$.

The recess or depression 171 must be filled with a medium having a refractive index n3 that is either lower or higher than the refractive index n1 of the light-guiding layer 1. The sidewall of the recess or depression 171 is then a refractive surface that forms the reflective surface 170 given a correct selection of the difference between the refractive index n1 of the light-guiding layer 1 and the refractive index n3 of the medium in the recess or depression 171. With the proper selection, then light impinging at an incident angle $\phi$ will be reflected by this reflective surface.

A reflective surface 170 of the light-guiding layer 1 can, for example, also be a refractive surface in the form of a boundary surface at which two differently doped zones of this layer 1 adjoin one another, whereby the different doping corresponds to a different refractive index. The reflective surface 170 can also be a mirrored surface, for example a mirrored sidewall of the recess or depression 171 in the light-guiding layer 1. A mirrored reflective surface 170 has the advantage that it reflects at every incident angle $\phi$ at which the supplied light beam, i.e., the axial ray thereof, impinges this mirrored surface 170, so that no special angular conditions, for example that required for total reflection, need be adhered to.

The incident angle $\phi$ is usually the angle between the axial ray of the light beam 13 and the surface normal 173 (FIG. 1) of the reflective surface 170 at the incident point 132 of the axial ray on this surface 170. The axial ray of a light beam means the individual ray propagating on the always-defined optical axis of this light beam. The axial ray of the light beam 13 guided in the light-guiding layer 1 is parallel to the layer plane 10 of this layer 1. The surface normal 173 of the reflective surface 170 of the light-guiding layer 1 is essentially parallel to the layer plane 10 of this layer.

In the Figures, the light beams 13 are shown essentially by the axial rays. In the Figures, each light beam 13, i.e., the axial ray thereof, impinges its infeed end face 11 at a point 131, its reflective surface 170 at a point 132 and its outfeed end face 12 at a point 133.

In the embodiment of FIGS. 1–3, the third or additional end face 15 of each light-guiding layer 1 is advantageously specifically arranged so that the angle $\beta$, is equal to 45°. Since the plane of the outfeed end face 12 is selected parallel to the coordinate plane x, y, the direction $\gamma 2$ in the coordinate plane x, z also describes an angle 45° with the direction x parallel to the defined plane x, z.

Given this oblique arrangement of the third end face 15 of each light-guiding layer, the reflective surface 170 of this layer at the incident point 132 of the light beam 13 onto the surface 170 can extend in the same direction $\gamma 2$ as this third end face 15, for example at an angle of 45° in the defined plane x, z relative to the direction x and the direction z.

This has the following advantages:

First, the axial ray of the light beam 13 to be coupled into every light-guiding layer 1 propagates in the direction x and perpendicularly impinges the infeed end face 11 of this layer 1 at a point 131, so that it couples into the layer 1 unrefracted, for example without deflection from the direction x parallel to the defined plane x, z. This axial ray impinges the reflective surface 170 of the layer 1 at a point 132 at an incident angle $\phi=45°$ and is deflected thereat by 90° into the direction z parallel to the defined plane x, z perpendicular to the outfeed end face 12 of the layer 1. The light beam is coupled out through the outfeed face 12 unrefracted at this point 133 without deflection from the direction z parallel to the defined plane x, z.

The entire dimension U (see FIG. 3) of this third end face 15 in the direction $\gamma 2$ is advantageously available (as can be derived from FIGS. 1 and 3) for this reflective surface 170, so that the surface 170 can extend over the entire dimension U and can, thus, also fully acquire the deflected light beams 13 having a large beam width parallel to the layer plane 10 of the light-guiding layers 1 as can occur, for example, given a highly divergent light beam 13.

The arrangement of the additional or third end faces 15 of the light-guiding layers 1 in the coordinate plane y, z obliquely at an angle $\alpha$ relative to the direction z parallel to the defined plane x, z in all embodiments means that the third end faces 15 are offset relative to one another in this direction z, for example are arranged at a spacing from one another. Since the beam deflecting means 17 are arranged in the region of the third end face 15, these, and specifically the reflective surfaces 170, are also arranged spaced from one another in the direction z.

This means that the light beams 13 to be coupled into the light-guiding layer 1 are also to be coupled into these layers 1 in this spacing from another in a direction z parallel to the defined plane x, z. This spacing is the spacing $\epsilon$ between the points 131 in which the axial rays of two light beams 13 to be coupled into neighboring light-guiding layers 1 are incident onto the infeed end faces 11 of these two layers 1, with the spacing $\epsilon$ being measured in the direction z in the Figures and, thus, parallel to the defined plane x, z.

Advantageously, the infeed end faces 11 need only satisfy the condition with respect to this offset coupling of the light beams 13 that coupling can, in fact, be carried out at the desired location 131 of the infeed end face 11 of each light-guiding layer 1.

This is certain to be assured when, as can be seen from FIGS. 2 and 3 and is realized in all illustrated embodiments for the sake of simplicity, the infeed end face 11 of each light-guiding layer 1 extends from the third end face 15 of this layer 1 continuously up to the outfeed end face 12 of the layer in the direction z parallel to the defined plane x, z. Advantageously, additional measures, for example window-defining masks on such infeed end faces 11, are not required, even though they could be present under certain circumstances.

The spacing $\epsilon$ parallel to the defined plane x, z for the light beams 13 to be coupled into the light-guiding layer can be advantageously set by the prescribable angle $\alpha$ at which the third end faces 15 are obliquely arranged relative to the defined plane x, z. The spacing $\epsilon$ is thereby arbitrarily adjusted within broad limits.

This is of great advantage, as the following example of a plurality of semiconductor lasers 30 (see FIGS. 2 and 3) arrayed in a line 3 along a straight line 31 illustrate. Each individual laser 30 comprises a respective exit window 32 (see FIG. 3) from which a light beam 13 divergently emerges. The exit windows 32 are arranged along a straight line with a fixed invariable spacing a from one another and are identically oriented, so that the divergent light beams 13 emerging from all exit windows 32 propagate along a straight line 31 at the fixed spacing a from one another and in the same direction perpendicular to the straight line 31.

When these light beams 13 are to be converted into a more compact arrangement with the inventive device, each light beam is to be coupled into a respective light-guiding layer 1 of the device. It must thereby be considered that the light-guiding layers 1 are arranged at a fixed spacing a1 (FIG. 1) from one another in the direction y perpendicular to the defined plane x, z, which is likewise variable. For example, the spacing a1 is defined by the spacing of the central layer planes 10 of two neighboring light-guiding layers 1 from one another.

For being coupled into the light-guiding layers 1, the light beams 13 must impinge the infeed end faces 11 of these layers 1 in the spacing a1 in the direction perpendicular to the defined plane x, z and, at the same time, in the predetermined spacing $\epsilon$ from one another parallel to the defined plane x, z.

By arranging the lasers 30 relative to the infeed end faces 11 of the light-guiding layers 1, the light beams of the lasers 30 propagate perpendicular to the infeed end faces 11 and the straight line 31 is arranged parallel to the infeed end faces 11 and obliquely at such an angle relative to the defined plane x, z. This is achieved when the spacing a between the light beams 13 multiplied by the sine of this angle is equal to the predetermined spacing $\epsilon$, which is equal to the spacing a1 between the light-guiding layers 1 and the spacing a multiplied by the cosine of this angle.

Since the spacing $\epsilon$ is equal to the spacing between the neighboring points 132, wherein the beam deflecting devices 17 of the neighboring layers 1 are impinged by the light beams 13 of the neighboring lasers 30, parallel to the infeed end faces and multiplied by the cosine $\alpha$, the straight line 31 is to be arranged at an angle $\alpha$ to the defined plane x, z so that the straight line 31 extends in the above-defined direction $\gamma 1$ and $a1 = a \cdot \sin \alpha$ and $\epsilon = \alpha \cdot \cos \alpha$.

In semiconductor laser lines, each laser 30 usually occupies a certain length b (FIG. 2) on the straight line that is smaller than the spacing a between neighboring lasers 30 so that a gap d is respectively present between neighboring lasers 30 and the distance $a = b + d$.

Expediently, the layer thickness d1 of every light-guiding layer 1 is selected at least approximately equal to the length b multiplied by the sine of the angle of the straight line 31 with the defined plane x, z, and the thickness d2 of every intermediate layer 2 between the neighboring light-guiding layers is selected approximately equal to the gap d between the two semiconductor lasers multiplied by the sine of this angle.

The light beam 13 emitted by the semiconductor laser 30 is highly divergent both in the direction y perpendicular as well as parallel to the defined plane x, z. due to the divergence of the light beam 13 in the direction y perpendicular to the defined plane x, z, and in order to optimally couple as much laser light into a light-guiding layer 1 as possible, the light exit window should be arranged at an adequately small spacing a3 (FIG. 3) from the infeed face 11 of the layer 1.

The margin rays of the highly divergent light beam 13 of the semiconductor laser 30 are also indicated with broken lines in FIG. 3 and not to scale at both sides of the axial ray.

The margin rays, for example, diverging and describing different divergence angles $\theta$ after respectively passing through sections with different refractive indices.

Likewise, for avoiding light losses, the numerical aperture of the infeed end face 11 of each light-guiding layer 1 should be well-matched to the aperture of the semiconductor laser 30, whose light beam 13 is to be coupled into this layer, and the beam deflection means 17 of the layer 1, specifically the reflective surface 170, should, respectively, extend parallel to the layer plane 10 of this layer 1 in the direction perpendicular to the propagation direction of the axial ray of this light beam to such an extent that it acquires all of the light of the light beam insofar as possible and deflects it in the direction parallel to the layer plane 10 of the layer 1. This is optimally realized in the embodiment of FIGS. 1–3 since, as already mentioned, the reflective surface 170 of every light-guiding layer 1 can extend over the entire dimension U in the direction $\gamma 2$ of the third end face 15 of the layer 1.

Likewise for avoiding light losses, moreover, the outfeed end face 12 of the light-guiding layer 1 should comprise a dimension in the direction parallel to the layer plane of this layer 1 that is at least as big as the beam width b2 (FIG. 3) of the light beam 13 guided in this layer 1 when incident onto the outfeed end face 12, as measured parallel to the layer plane 10, so that all of the light in the light beam 13 can be coupled out of this outfeed end face 12. In this case, the aperture of this outfeed end face 12 is determined solely by the divergence or convergence angle of the light beam 13 with given refractive indices n1 and n2.

The inventive device is advantageously employable for converting the divergent light beams generated by a semiconductor laser line 3 and separated from one another into a more compact arrangement or beam 14 of these light beams, which are to be supplied into an optical multi-mode waveguide 4, for example, a multi-mode fiber.

FIGS. 2 and 3 schematically show such a multi-mode fiber 4 in the form of a core-cladding fiber. As known, the fiber is composed of a core 40 of a specific refractive index n4 having a circular cross section and of a cladding 41 surrounding the circular cylindrical circumference of the core 40 that comprises a lower refractive index n5 compared to the refractive index n4 of the core 40. The core 40 comprises a diameter d4 that is at least equal to the height h (see FIG. 2) of the layer stack composed of all light-guiding layers 1 and the layers 2 arranged between the layers 1, that is not greater than the width b2 of each of the light beams 13 forming the arrangement or combined beam 14 together coupled out of the outfeed end faces 12 of the light-guiding layers 1.

The height h is established by $k \cdot d1 + (k-1) \cdot d2$, wherein k denotes the plurality of light-guiding layers 1, d1 denotes the layer thickness of the light-guiding layers 1 and d2 denotes the layer thickness of the intermediate layers 2. For the sake of clarity, k=4 in the illustrated embodiments shown in the Figures. A practical realization of the inventive device comprises a greater plurality of light-guiding layers 1 and k being a larger number.

A more compact arrangement of the light beams 13 fits cross sectionally into the area h·b2 in the outfeed end face 12. In this outfeed end face 12, the light beam 13 coupled out of the outfeed end face 12 of every light-guiding layer 1 has approximately the cross section d1·b2 and has, at most, the cross section d1·b1 in the infeed end face of this layer, whereby b1 is the beam width b1 of the light beam 13 coupled into the layer 1, as measured parallel to the defining plane x, z.

At least in the outfeed end face 12, the more compact arrangement 14 is composed gap-free of the light beams 13 and becomes uniform at most at a certain distance in the direction z from these end faces 12. This, however, is of no significance for the infeed into a waveguide 4.

In order to avoid light losses when coupling the light beams 13 of the more compact arrangement into the optical waveguide 4, the end face 42 of the waveguide 4 provided for the coupling should be arranged at a proper spacing a4 (FIG. 2) from the outfeed end face 12 of the light-guiding layer 1, and the numerical aperture of the outfeed end face 12 of every light-guiding layer 1 should be matched optimally well to the numerical aperture of the end face 42 of the waveguide 4.

As already mentioned, the numerical aperture of the outfeed end face 12 is determined by the divergence angle $\theta$ of the light beam 13 that is coupled out of the outfeed end face 12.

With given refractive indices n1 and n2, the divergence angle $\theta$ of the light beam 13 coupled out of the outfeed end face 12 of every light-guiding layer 1 and, thus, the numerical aperture of this outfeed end face 12 can be modified with a beam-shaping means 18 of the layer 1 for shaping the light beam 13 that is guided in this layer 1 and propagates divergently in the layer plane 10 of the layer 1. For example, it can be diminished or even be made convergent if the angle $\theta$ is too big for the waveguide 4 or unsuitable in other ways.

Such a beam-shaping means 18 fashioned in the light-guiding layer 1 for shaping the light beam 13 being guided in this layer 1 is advantageously composed of the reflective surface 170 fashioned in this layer that proceeds along a curve in the layer plane 10 of the layer 1 not on a straight line and thus is curved cylindrically. For example, a concave or convex side of the curvature faces toward the light beam 13 supplied to the surface 170. In the exemplary embodiment of FIGS. 1–3, for example, the concave side of the curvature faces toward the light beam 13 supplied to the surface 170 and the light beam 13 can be collimated or focused with such a curved surface 170, for example onto the end face 42 of the waveguide 4. This also enables a real optical imaging of the light sources onto specific image surfaces in a prescribable imaging scale, for example the real optical image of the light exit window 32 of the lasers 30 onto the end face 42 of the waveguide 4.

A beam-shaping means 18 of the light-guiding layer 1 can also be realized as an optical lens fashioned in the beam path of the light beam 13, for example in the form of a refractive lens formed at the infeed end face 11 and/or on the outfeed end face 12 of each layer In the exemplary embodiment of FIGS. 1–3, there is a special characteristic that the beam deflection device 17 in the form of reflective surfaces 170 of the various light-guiding layers 1 are arranged at the same defined spacing E1 (FIG. 3) from the infeed end faces 11 of these layers. Per light-guiding layer 1, this spacing E1 is specifically the spacing, measured in the direction x parallel to the defined plane x, z, between the infeed end face 11 of the layer 1 and the point 132 on the reflective surface 170 of this layer in which the axial ray of the light beam 13 coupled in through the infeed end face 11 of this layer impinges this reflective surface.

In the preferred case realized in all illustrated embodiments, the infeed end faces 11 are arranged in a common plane. This device of the deflection means 17 with the same spacing E1 from the infeed end faces has the advantage that the axial rays of the light beams 13 deflected at all deflection devices 17 can propagate in the same direction, for example the direction z, and can be arranged one above the other in the direction y perpendicular to the defined plane x, z.

When the deflection devices 17 in the light-guiding layer 1 are realized, for example, by a reflecting surface 170 in the form of a sidewall of a groove, recess or depression 171 in this layer, it is expedient when this sidewall 170 extends over the entire layer thickness of this layer 1 in the region of the third end face 15, since light losses given reflection at the sidewall 170 are then minimal. This, however, requires that the recess or depression 171 comprises a depth t (see FIG. 2) that is at least equal to this layer thickness but must usually be greater in practice so that a reflective surface 170 having adequately good optical quality will occur. Under certain circumstances, it can be required, therefore, to make the recess or depression 171 so deep that it extends through an intermediate layer 2 into a neighboring light-guiding layer 1.

Given the embodiment of FIGS. 1–3, the light beam 13 guided in the neighboring layer 1 and reflected at the beam deflection means 17 of this layer would inevitably impinge the part of the recess or depression 171 extending from the neighboring layer 1 and could be disturbed by this depression.

Given light beams having not too great a beam width and/or not at all a great divergence angle, this problem can be solved in that the beam deflection devices 17 of different light-guiding layers are arranged at mutually different spacings E1 from the infeed end faces of these layers.

When the beam deflecting device 17 or, respectively, the surface 170 of the neighboring light-guiding layers 1 are arranged at an adequately great different spacing from one another, the light beam 13 reflected by the beam deflection device 17 or, respectively, the surface 170 of a light-guiding layer can pass largely undisturbed laterally past the beam deflection devices 17 or the surfaces 170 of the neighboring, other light-guiding layers onto which it would otherwise be incident.

However, it must thereby be taken into consideration that the axial rays of the light beams 13 deflected by the deflection devices 17 or the reflective surfaces 170 arranged at different spacings E1 must impinge the outfeed end faces of the light-guiding layers in different points 133 that are arranged essentially above one another in the direction y perpendicular to the defined plane x, z so that these light beams 13, as required, are arranged one above the other in the direction y when being coupled out of the outfeed end faces 12 for forming a more compact arrangement 14 of the light beams 13.

This requires that these deflected axial rays must propagate parallel to the defined plane x, z not in the same but in propagation directions that are different from one another.

After being coupled out of the outfeed end faces 12 of the light-guiding layers 1, these axial rays propagate divergently relative to one another. This results in a further divergence angle per individual light beam 13 that must be taken into consideration in the matching to the numerical aperture of a waveguide 4 in addition to the divergence angle $\theta$ of the individual light beams 13 themselves.

FIG. 4 shows one example, while FIG. 5 another example, of an embodiment wherein the reflective surfaces 170 are arranged at different spacings from one another. Both embodiments refer to the case of $\beta=90°$. However, they could be realized just as easily given the case of $\beta<90°$, particularly $\beta=45°$, as in the embodiment of FIGS. 1–3.

In the embodiment of FIG. 4, the spacing exhibits two values, a lower spacing $\epsilon1$ and a higher spacing $\epsilon1'$. The reflective surfaces 170, shown here simplified with a respective straight line, are arranged so that they are arranged in the one spacing $\epsilon1$ and the other spacing $\epsilon1'$ and in alternation in the direction z.

In the embodiment of FIG. 5, the spacings ∈11–∈14 exhibit a respectively different value for each light-guiding layer, so that the reflective surfaces 170, likewise shown simplified here by a respective straight line, are arranged in a value of the spacings ∈11–∈14 that increases in the direction z from reflective surface 170 to reflective surface 170.

In both embodiments of FIGS. 4 and 5, the axial rays of the light beams 13 reflected by the different reflective surfaces 170 propagate parallel to the layer planes 10 of the light-guiding layers 1 in a direction z' deviating from the direction z. This varying from light-guiding layer 1 to light-guiding layer 1 describes a correspondingly varying angle Φ with the direction z in the defined plane x, z and being respectively shown for only one light beam 13 in FIGS. 4 and 5.

However, it can be respectively derived from FIGS. 4 and 5 that all light beams 13 reflected at the different reflective surfaces 170 propagate in the direction z' different from one another so that the axial rays of the reflected beams 13 in every light-guiding layer 1 passes laterally past the reflective surface 170 of the light-guiding layer 1 neighboring this layer that follows next in the direction z at a spacing, so that the light beam 13 itself can pass by this next following reflective surface largely undisturbed.

Corresponding to the different directions z' of the reflected beams 13, the reflective surfaces 170 of the various light-guiding layers given the embodiments of FIGS. 4 and 5 cannot extend in the direction γ2 that, in this case, is identical with the direction x, but must extend parallel to the layer planes 10 of these layers in a direction γ2' that is different therefrom and from one another.

This results therein that, given the embodiments of FIGS. 4 and 5 for a reflective surface 170 different from the embodiment according to FIGS. 1–3, the entire dimension U of the third end face 15 of the light-guiding layer 1 is not available in the direction γ2 but only part thereof. Although the reflective surface 170 can extend over an entire dimension V of the third end face 15 of the layer 1 in the direction γ1 residing obliquely at an angle α to the direction z, this dimension V is limited by the predetermined layer thickness d1 of the layer 1 and by the angle α, whereas such a limitation does not apply to the dimension U so that this dimension U can be selected larger than the dimension V.

Strictly considered, the latter is valid only given the pre-condition assumed in all illustrated embodiments that the axial ray of each light beam 13 to be coupled into a light-guiding layer 1 perpendicularly impinges the infeed end face 11 of this layer and remains unrefracted at the infeed end face 11.

The latter is not necessarily a condition. The axial ray of the light beam 13 to be coupled into a light-guiding layer can also impinge the infeed end face of this layer at an oblique incident angle. In this case, it is refracted at this infeed end face 11 and this refraction is to be taken into consideration in the device or in the fashioning of the beam deflecting means 17 or, respectively, the surface 170 of this layer.

Given proper selection of the oblique incident angle, the reflective surface 170 of the layer 1 can, under certain circumstances, also extend in the direction γ2 identical to the direction x given the embodiments of FIGS. 4 and 5, since the axial ray refracted at the infeed end face 11 of this layer can be obliquely incident onto the reflective surface 170.

In the embodiment of FIG. 5, there is a special characteristic compared to the embodiment of FIG. 4 that this light beam 13 runs up to the outfeed end face 12 of the layer 1 laterally past all reflective surface 170 following the next following reflective surface 170 in the direction z.

As shown, the reflective surfaces 170 of the exemplary embodiment according to FIG. 5 can be part of a larger limiting surface 172 of the entire layer stack that faces away from the infeed end faces 11 of the light-guiding layers 1 and is essentially perpendicular to the layer planes 10 of the layers 1. The surface 172 proceeds parallel to the layer planes 10 of these layers 1 polygon-like or as a continuously curved, for example having a spacing ∈11–∈14 between the reflective surfaces 170 in the region of the third end face 15 of a light-guiding layer 1 and the infeed end face 11 of this layer 1 continuously increases in the direction z.

These characteristics can also be realized given angles β unequal to 90°.

A beam-shaping means 18 can also be realized in the light-guiding layer 1 in the embodiments of FIGS. 4 and 5, for example in the form of a reflective surface 170 in the region of the third end face 15 of this layer 1 that, however, does not proceed parallel to the layer plane 10 of the layer on a straight line but proceeds curved, similar to the embodiment of FIGS. 1–3.

The inventive device can be advantageously employed for converting a light beam 13 with a larger beam cross section into a plurality of mutually separated sub-beams 13, respectively, having the smaller beam cross sections g, whereby the outfeed end faces 12 are to be employed for coupling the light beam 14 with the larger cross section into the light-guiding layers 1 and the infeed end faces 11 are to be employed for coupling the light beams 13 having the respectively smaller beam cross section g out; in other words, reversing the direction of the light through the device.

The manufacture of the inventive device is very simple. The light-guiding layers 1 and intermediate layers 2 can be successively deposited on a substrate in a predetermined sequence, for example by deposition of glass with flame hydrolysis on a substrate of silicon.

In addition, the third end faces 15 can be produced by grinding the generated layer stack so that the planar facet residing at least at an angle α to the layer planes 10 of the light-guiding layers 1 will occur, and by polishing this facet. The end faces 15 lie freely accessible in this polished facet.

The infeed end faces 11 and the outfeed end faces 12 can lie in polished, planar end faces of the layer stack residing at an angle relative to one another. As warranted, a larger limiting surface 172 of the layer stack containing the reflective surfaces 170 can also be a polished facet.

The infeed faces 11, the outfeed faces 12 and the third end faces 15 and, potentially, the larger limiting surface 172 of the layer stack can also be produced by etching the generating layer stack with lithography.

A reflective surface 170 in the region of the third end face 15 of the light-guiding layer 1 in the form of a lateral sidewall of a recess or depression 171 formed in this layer can be produced by lithographic etching and can also be produced by sawing in the case of the reflective surfaces 170 proceeding parallel to the layer plane 10 of the layer on a straight line.

An advantageous application of the inventive device is the concentration of the laser powers respectively emitted by a plurality of power semiconductor layers arranged in a line onto an end face of a multi-mode fiber, such that all of these powers are coupled into the fiber and are forwarded therein as a bundle of powers. Each of these power semiconductor lasers is composed not only of a single semiconductor laser but a plurality thereof, typically 20, that are arranged side-by-side in close proximity and can be viewed as a single unit.

In the immediate proximity of the light exit window of every power semiconductor laser, the cross section of the laser beam emitted by it is a line, given adequately small resolution. The cross sections become more planar only with increasing distance from the power semiconductor laser because of the divergence of the individual laser beams. Each line typically comprises seven such power semiconductor lasers that are arranged on a straight line 31 spaced from one another; however, there can also be more or fewer lasers.

With reference to the inventive application under discussion, the power semiconductor laser 30, whose exit windows 32 are respectively composed of a plurality of individual light exit windows of the plurality of individual lasers arranged in close proximity, are arranged on the straight line 31 at a spacing a from one another, and the laser beam emitted by each power semiconductor laser 30 forms the light beam 13, whose cross section is line-like in the immediate proximity of the exit window and becomes more planar with increased distance therefrom.

The multi-mode fiber into which coupling is to be carried out is the fiber 4 having the end face 42. In order to introduce optimally as much of the laser power emitted by the semiconductor lasers 30 into the fiber 4, it is initially necessary to arrange each semiconductor laser 30 at such a slight spacing a3 (FIG. 3) from the infeed end face 11 of the light-guiding layer 1 into which the laser beam 13 emitted by this laser is to be coupled so that the cross section of the beam is optimally entirely incident into the infeed end face 11 of the layer 1 and the numerical aperture of this infeed end face 11 is at least equal to that of the laser 30.

It is then necessary to introduce the optical power coupled out of the outfeed end face 12 of every light-guided layer 1 as completely as possible into the fiber 4. To that end, the numerical aperture of each outfeed end face 12 dare be at most equal to the fiber 4, and the beam cross section g of the light beam 13 coupled out of each outfeed end face 12 must fall into the region of the core 40 of the end face 42 of the fiber 4. The latter can be advantageously achieved in that the light exit windows 32 of the semiconductor lasers 30 from which the light beams 13 emerge are imaged more compactly onto the end face 42 as an imaging scale defined by the region of the core 40 of the end face 42 of the fiber 4. This can be unproblematically realized with the beam-shaping means 18 given the inventive device.

Although various minor modifications may be suggested by those versed in the art, it should be understood that we wish to embody within the scope of the patent granted hereon all such modifications as reasonably and properly come within the scope of our contribution to the art.

We claim:

1. A device for the conversion of a plurality of light beams that propagate with a predetermined spacing from one another measured parallel to a defined plane into a relatively more compact beam of these light rays, said device comprising a plurality of light-guiding layers, each of which is provided for the infeed, guidance and outfeed in turn of respectively one of the light beams, each layer having an infeed end face for coupling the respective light beam into the layer, an outfeed end face from which the infed light beam is supplied in this layer, said light-guiding layers being composed of flat planar layers that are arranged parallel to the defined plane above one another in a first direction perpendicular to the defined plane, so that both the infeed end faces as well as the outfeed end faces of the various layers are located one above the other in said first direction and the infeed light beams propagate essentially freely in every layer, the light beams being coupled into the layers through the infeed end faces upon retention of the spacing from one another parallel to the defined plane and beam deflecting means being fashioned for every layer, said beam deflecting means deflecting the infed light beam guided in the layer to the outfeed end face of the layer so that the light beam deflected by all beam deflecting means are incident onto the outfeed end faces above one another in said first direction perpendicular to the defined plane.

2. A device according to claim 1, wherein the beam deflecting means of a layer is composed of a reflective surface formed in this layer and residing essentially perpendicular to the defined plane for the deflection of the light beam guided in this layer in a direction to the outfeed face thereof.

3. A device according to claim 2, wherein a beam-shaping means is fashioned in the light-guiding layer for shaping the light beam guided in the layer and is composed of a reflective surface fashioned in this layer that forms a curve in the defined plane.

4. A device according to claim 1, wherein each light-guiding layer comprises a respectively additional third face that is arranged obliquely at an angle to the defined plane and at a angle to the infeed end face of the layer as measured in this defined plane and the beam deflecting means is fashioned in the region of this third end face of the layer.

5. A device according to claim 1, wherein the beam deflecting means of the various light-guiding layers is arranged at a different spacing from the infeed end face of this layer.

6. A device according to claim 1, wherein the deflecting means of the various light-guiding layers are arranged at the same spacing from the infeed end face of these layers.

7. A device according to claim 1, which includes beam-shaping means being fashioned in the light-guiding layer for shaping the light beam guided in the layer and propagating parallel to the defined plane.

8. A device according to claim 1, wherein the infeed end face and the outfeed end face of every layer reside at an angle relative to one another.

9. A device according to claim 1, wherein the neighboring light-guiding layers are separated by layers that are arranged between these layers and have a lower refractive index compared to the refractive index of the light-guiding layers.

10. A method of converting a plurality of divergent light beams generated by a plurality of semiconductor lasers and propagating with a predetermined spacing from one another parallel to a defined plane into a relatively more compact group of the light beams, said method comprising the steps of providing a device having a plurality of light-guiding layers, each of which is provided for the infeed, guidance and outfeed in turn of respectively one of the light beams, each layer comprising an infeed end face for coupling the respective light beam into the layer and outfeed end face in which light that is supplied to the layer is coupled out, said layers being composed of flat planar layers and being arranged parallel to a defined plane above one another in a direction extending perpendicular to the defined plane so that the infeed end faces and the outfeed end faces of the various layers are located above one another in said direction and beam deflecting means for each of the layers, said beam deflecting means deflecting the infed light guided in the layer to the outfeed end face of the layer so that the light beams are deflected by the beam deflection means are incident on the outfeed end face above one another in said direction perpendicular to the defined plane; coupling light from said lasers into each of said layers; and providing an arrangement adjacent the output end faces for receiving the light coupled from said layers.

11. A method of converting light beams having a larger beam cross section into a plurality of sub-beams having a respectively smaller cross section propagating at a spacing from one another, said method comprising the steps of providing a device having a plurality of light-guiding layers, each of which is provided with an infeed guidance and an outfeed in turn respectively for one light beam, each layer comprising a first end face, a second end face, said layers being composed of flat planar layers that are arranged parallel to the defined plane and above one another in a direction perpendicular to said plane so that both the first end faces and the second end faces of the various layers are located above one another in said direction and so that a light coupled in each of the layers can propagate essentially freely in said layer, a beam deflecting means being fashioned for each layer, said beam deflecting means deflecting the light from the first end faces guided in this layer to the second end face of the layer so that the light beams deflected by all beam deflecting devices are incident onto one of the first and second infeed faces above one another in said direction perpendicular to the defined plane; coupling the light beam having a larger cross section into the second end faces of said layers, and out feeding the light as individual light beams from each of the layers from the first end faces to provide a plurality of sub-beams having a respectively smaller cross section.

* * * * *